United States Patent
Uedaira

(10) Patent No.: US 11,227,902 B2
(45) Date of Patent: Jan. 18, 2022

(54) LIGHT RECEIVING IC, PROXIMITY SENSOR AND ELECTRONIC MACHINE

(71) Applicant: Rohm Co., Ltd., Kyoto (JP)

(72) Inventor: Yoshitsugu Uedaira, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/846,679

(22) Filed: Apr. 13, 2020

(65) Prior Publication Data

US 2020/0335555 A1 Oct. 22, 2020

(30) Foreign Application Priority Data

Apr. 18, 2019 (JP) .............................. JP2019079571

(51) Int. Cl.
*H01L 27/32* (2006.01)
*G06F 3/0354* (2013.01)
*G06K 9/00* (2006.01)

(52) U.S. Cl.
CPC ........ *H01L 27/323* (2013.01); *G06F 3/03547* (2013.01); *G06K 9/00033* (2013.01)

(58) Field of Classification Search
CPC .............. H01L 27/323; G06F 3/03547; G06K 9/00033
See application file for complete search history.

(56) References Cited

U.S. PATENT DOCUMENTS

| | | | | |
|---|---|---|---|---|
| 2008/0297487 | A1* | 12/2008 | Hotelling | G06F 3/0446 345/173 |
| 2011/0248171 | A1* | 10/2011 | Rueger | G01S 11/12 250/340 |
| 2012/0162636 | A1* | 6/2012 | Sy | G06F 1/3231 356/51 |
| 2016/0058374 | A1* | 3/2016 | Matsuno | A61B 5/02438 600/324 |
| 2018/0364869 | A1* | 12/2018 | Lee | G06F 3/0421 |

FOREIGN PATENT DOCUMENTS

JP     2017-027595     2/2017

* cited by examiner

*Primary Examiner* — Chanh D Nguyen
*Assistant Examiner* — Ngan T. Pham-Lu
(74) *Attorney, Agent, or Firm* — Fish & Richardson P.C.

(57) ABSTRACT

The present disclosure describes a light receiving IC, a proximity sensor and an electronic machine capable of expanding a display area of an electronic machine having a proximity sensor. A light receiving IC includes: a driving portion, driving an LED that emits light; and a light receiving element, detecting reflected light. The light receiving IC is disposed in a region that is under an OLED panel and is covered by the OLED panel.

20 Claims, 13 Drawing Sheets

LIGHT RECEIVING IC, PROXIMITY SENSOR AND ELECTRONIC MACHINE

BACKGROUND OF THE INVENTION

Field of the Invention

The present invention relates to a light receiving IC (Integrated Circuit), a proximity sensor and an electronic machine.

Description of the Prior Art

An electronic machine such as a smart phone includes a proximity sensor for detecting an approaching object. The proximity sensor emits infrared light, and detects the presence of an object by detecting infrared light reflected from the object.

A proximity sensor in the electronic device in patent document 1 is provided in a bezel area around an electronic machine.

PRIOR ART DOCUMENTS

Patent Publication

[Patent document 1] Japan Patent Publication No. 2017-27595

SUMMARY OF THE INVENTION

Problems to be Solved by the Invention

In patent document 1, a region for arranging a proximity sensor needs to be provided in the bezel area, and thus the area of the bezel area is increased, and the display area of an electronic machine is reduced as a result.

Therefore, it is an object of the present invention to provide a light receiving IC, a proximity sensor and an electronic machine in which a display area of the electronic machine having a proximity sensor may be expanded.

Technical Means for Solving the Problem

To solve the described issue, the light receiving IC of the present invention may be configured in an electronic machine having an OLED (Organic Light-Emitting Diode) panel, and includes: a driving portion, driving an LED (Light-Emitting Diode) that emits light; and a light receiving element, detecting reflected light. The light receiving IC is disposed in a region that is under the OLED panel and is covered by the OLED panel.

Preferably, the driving portion drives a plurality of LEDs.

Preferably, the driving portion controls infrared light to be emitted concurrently from the plurality of LEDs.

Preferably, the driving portion includes a plurality of drivers each driving one corresponding LED among the plurality of LEDs.

A proximity sensor of the present invention includes the foregoing light receiving IC and the LED.

A proximity sensor of the present invention includes the foregoing light receiving IC and a plurality of LEDs.

Preferably, the light receiving IC and the plurality of LEDs are configured on mutually different modules.

Preferably, respective centers of a pair of LEDs among the plurality of LEDs are configured on positions symmetric with respect to a center that is the center of the light receiving element.

Preferably, the plurality of LEDs are equidistantly arranged on a circle having a center that is the center of the light receiving element.

An electronic machine of the present invention includes the OLED panel and the proximity sensor.

Effects of the Invention

A display area of an electronic machine having a proximity sensor may be expanded according to the present invention.

DETAILED DESCRIPTION OF THE EMBODIMENTS

Embodiments are described with the accompanying drawings below.

In the description below, a smart phone is used as an example of an electronic machine for illustration. However, the present invention is not limited to such example, and other examples such as portable communication apparatuses other than smart phones, including touch pads, televisions, cameras and music players, may be included.

First Embodiment

In the description below, a smart phone is taken as an example of an electronic machine for illustration.

Figure 1:
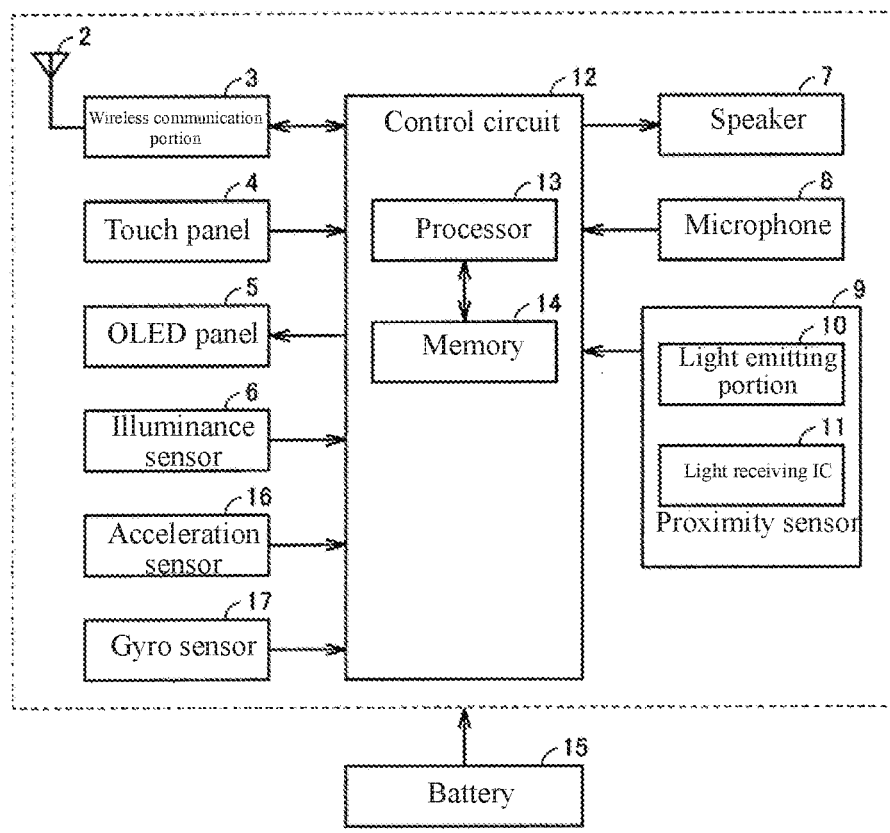
FIG. 1 is a diagram of the main configuration of a smart phone according to an embodiment.

FIG. 1 shows a diagram of the main configuration of a smart phone according to an embodiment.

A smart phone 100 includes an antenna 2, a wireless communication portion 3, a touch panel 4, an OLED panel 5, an illuminance sensor 6, a speaker 7, a microphone 8, a proximity sensor 9, an acceleration sensor 16, a gyro sensor 17, a control circuit 12, and a battery 15. The proximity sensor 9 includes a light emitting portion 10 and a light receiving IC 11. The control circuit 12 includes a processor 13 and a memory 14.

The antenna 2 sends a wireless signal to a base station, and receives a wireless signal from the base station.

The wireless communication portion 3 amplifies and down-converts the wireless signal sent from the antenna 2, and outputs the processed wireless signal to the control circuit 12. The wireless communication portion 3 up-converts and amplifies a transmission signal including such as an audio signal generated in the control circuit 12, and outputs the processed wireless signal to the antenna 2.

The touch panel 4 detects a contact or approach of an object such as a finger of a user, and outputs a detection signal corresponding to the detection result to the control circuit 12.

The microphone 8 converts an audio inputted from the outside of the smart phone 100 into an electrical audio signal, and outputs the electrical audio signal to the control circuit 12.

The speaker 7 converts the electrical audio signal from the control circuit 12 into an audio and then outputs the audio.

The acceleration sensor 16 detects the acceleration of the smart phone 100.

The gyro sensor 17 detects the rotation speed of the smart phone 100.

The OLED panel 5 displays various types of information such as characters, symbols and graphics by the control of the control circuit 12.

The illuminance sensor 6 detects the ambient luminance of the surrounding environment, and outputs a detection signal corresponding to the detection result to the control circuit 12.

The proximity sensor 9 detects the approach of an object, and outputs a detection signal corresponding to the detection result to the control circuit 12. Upon detecting the approach of an object, the control circuit 12 sets the touch panel 4 and the OLED panel 5 to a turned-off state.

The light emitting portion 10 emits infrared light.

The light receiving IC 11 controls the infrared light emitted from the light emitting portion 10, and detects the infrared light emitted from the light emitting portion 10 and reflected by the object.

The processor 13 is composed of a CPU (Central Processing Unit) and a DSP (Digital Signal Processor).

The memory 14 stores a control program for controlling the smart phone 100 and a plurality of applications. Various functions of the control circuit 12 are realized by executing various programs in the memory 14 by the processor 13.

The battery 15 supplies power to the electronic components included in the smart phone 100.

Figure 2:
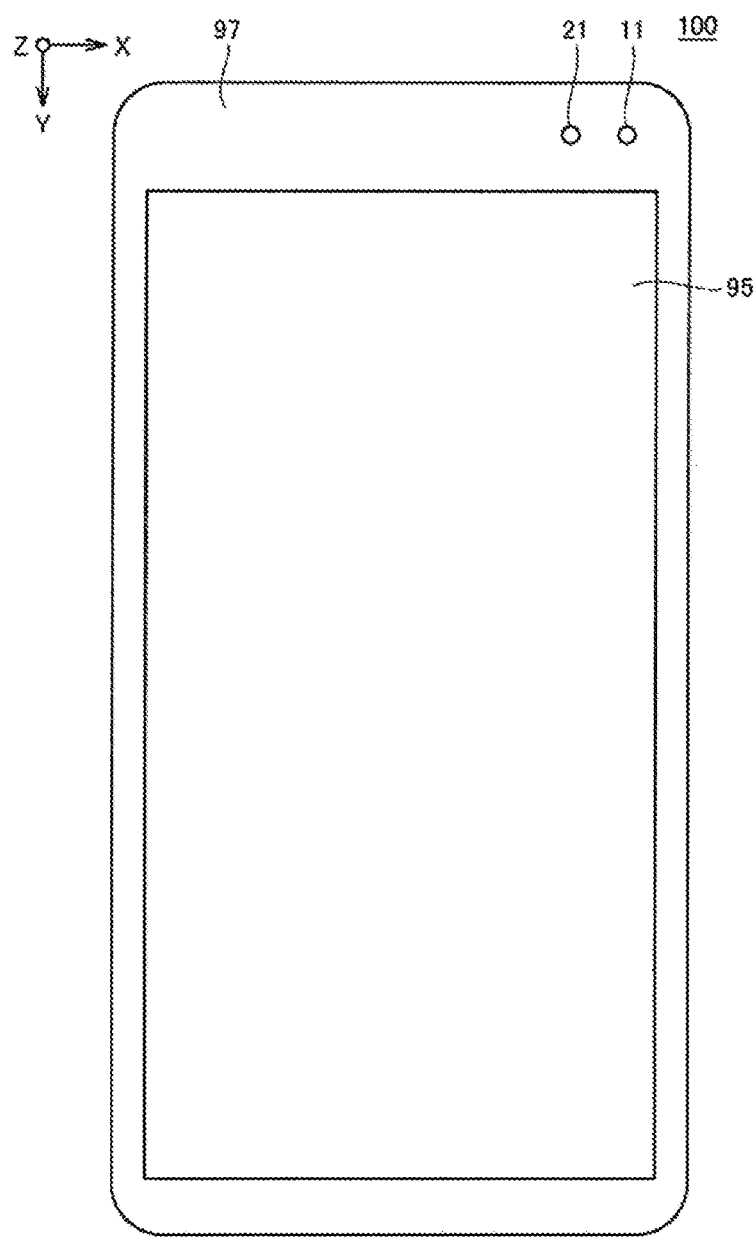
FIG. 2 is a diagram of the arrangement of a proximity sensor of a smart phone having a liquid crystal panel.

FIG. 2 shows a diagram of the arrangement of a proximity sensor of a smart phone including a liquid crystal panel.

As shown in FIG. 2, the long-side direction of the smart phone 100 is set as the Y-axis direction, the short-side direction of the smart phone 100 is set as the X-axis direction, and the normal direction of the obverse side of the smart phone 100 is set as the Z-axis direction. In the description below, a so-called lower side is set as the negative direction of the Z axis, and a so-called upper side is set as the positive direction of the Z axis.

In a conventional proximity sensor, the light receiving IC 11 and an LED 21 are disposed on the lower side of a bezel 97, and the light receiving IC 11 and the LED 21 are then necessarily disposed in a region of the bezel 97, resulting in an increased area of the bezel 97 and hence a reduced area of a liquid crystal panel 95.

Figure 3:
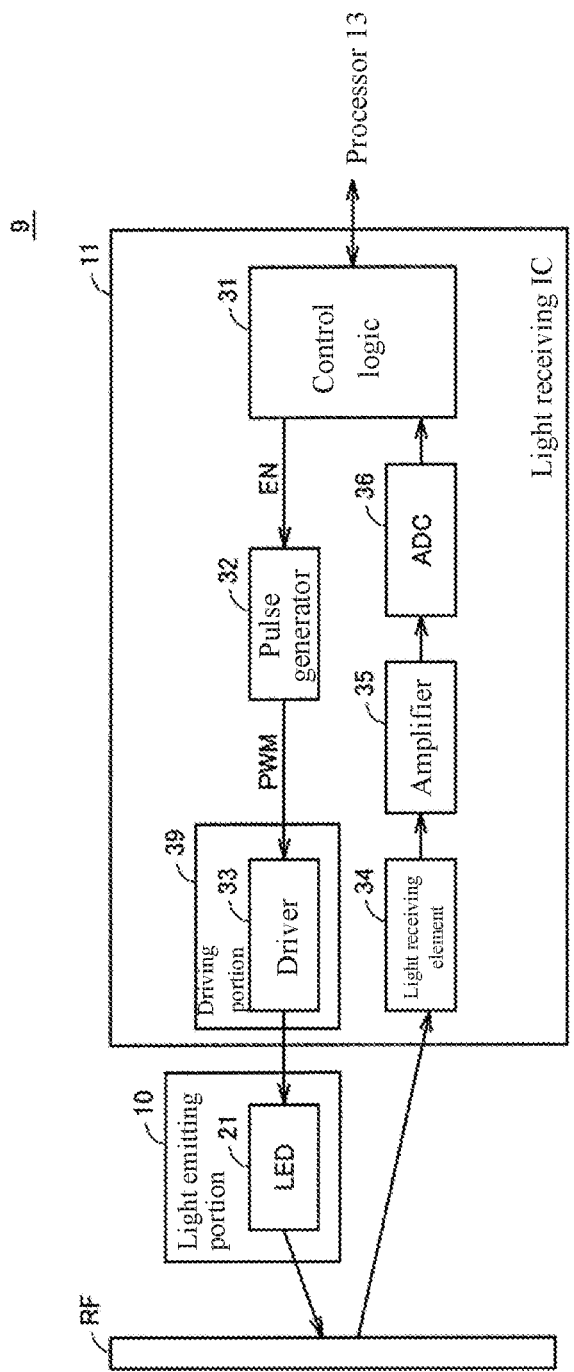
FIG. 3 is a diagram of the configuration of a proximity sensor 9 according to a first embodiment.

FIG. 3 shows a diagram of the configuration of the proximity sensor 9 according to a first embodiment.

The light receiving IC 11 includes a control logic 31, a pulse generator 32, a driving portion 39 including a driver 33, a light receiving element 34, an amplifier 35, and an ADC (Analog to Digital Converter) 36. The light emitting portion 10 includes the LED 21.

The control logic 31 controls driving of the LED 21 according to an instruction from the processor 13, and notifies the processor 13 of whether infrared light is received.

The pulse generator 32 outputs a PWM signal PWM.

The driver 33 drives the LED 21 according to the PWM signal PWM.

The light receiving element 34 detects infrared light reflected by an object RF. The light receiving element 34 is composed of a photodiode.

The amplifier 35 amplifies an output signal of the light receiving element 34.

The ADC 36 converts the output signal of the amplifier 35 into a digital signal, and outputs the digital signal to the control logic 31.

Figure 4:
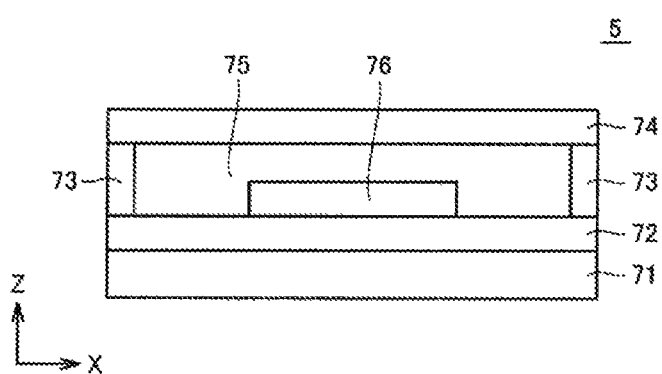
FIG. 4 is a diagram of an exemplary configuration of an OLED panel 5.

FIG. 4 shows a diagram of an exemplary configuration of the OLED panel 5.

The OLED panel 5 includes a substrate film 71, an inorganic film 72, an OLED layer 76, a sealer 75, a side sealer 73 and a sealing film 74.

The substrate film 71 is formed by a high polymer material. The inorganic film 72 is formed on the substrate film 71, and is formed by an inorganic material. The OLED layer 76 is formed on the inorganic film 72, and includes layers such as an anode layer, a cathode layer and a light emitting layer and further includes a plurality of OLED elements. The sealer 75 is formed on the inorganic film 72, is formed by a material having a high polymer material as the main component, and surrounds the OLED layer 76 so as to protect the OLED layer 76. The sealing film 74 is formed by way of covering the upper side of the sealer 75, and is formed by glass or a metal. The side sealer 73 is formed by way of covering the sides of the sealer 75, and is formed by a high polymer material and an additive.

The OLED panel 5 composed of the elements above has a 3 to 10% light transmittance with respect to the infrared light emitted from an LED.

Figure 5:
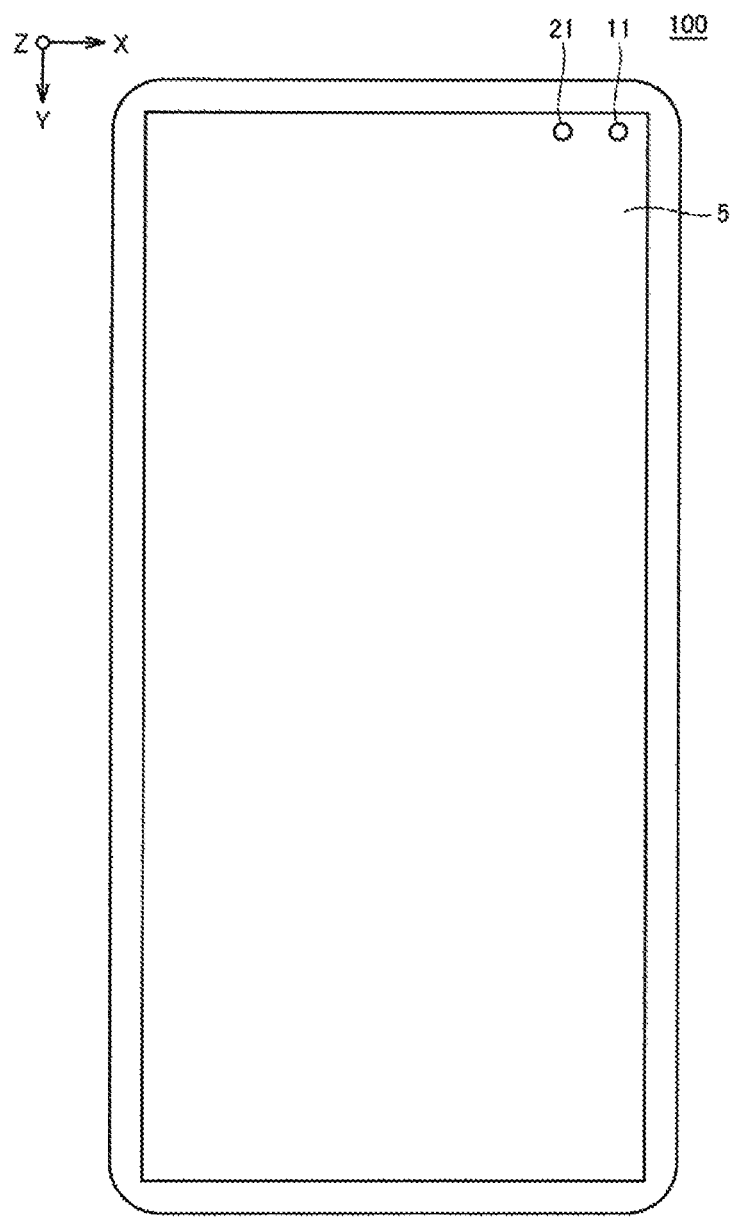
FIG. 5 is a diagram of the arrangement of the proximity sensor 9 according to the first embodiment.

FIG. 5 shows a diagram of the arrangement of the proximity sensor 9 according to the first embodiment.

In the proximity sensor 9 of the first embodiment, using the property of light transmittance of the OLED panel 5 with respect to the infrared light emitted from the LED, the light receiving IC 11 and the LED 21 are disposed in a region that is under the OLED panel 5 and is covered by the OLED panel 5. That is to say, assuming the position of the OLED panel 5 is a rectangular region represented by (x1, y1) to (x2, y2), the light receiving IC 11 and the LED 21 are disposed in the rectangular region.

In case that detection for an object approaching the proximity sensor 9 and an input to the touch panel 4 are concurrently generated, detection for the object approaching the proximity sensor 9 may be set and performed as a priority.

To minimize the conflict between detection for an object approaching the proximity sensor 9 and an input to the touch panel 4, the light receiving IC 11 and the LED 21 are disposed as much as possible on a corner of the region covered by the OLED panel 5. For example, as shown in FIG. 5, the light receiving IC 11 and the LED 21 may be arranged on the upper-right corner. Furthermore, in the region at the upper-right corner, items specified by a user touch may be left as not displayed.

Since the light receiving IC 11 and the LED 21 are disposed under the OLED panel 5, ensuring a region for disposing the light receiving IC 11 and the LED 21 in the bezel 97 is not necessary. Hence, the area of the bezel 97 may be reduced, and the area of the OLED panel 5 may be increased as a result.

Figure 6:
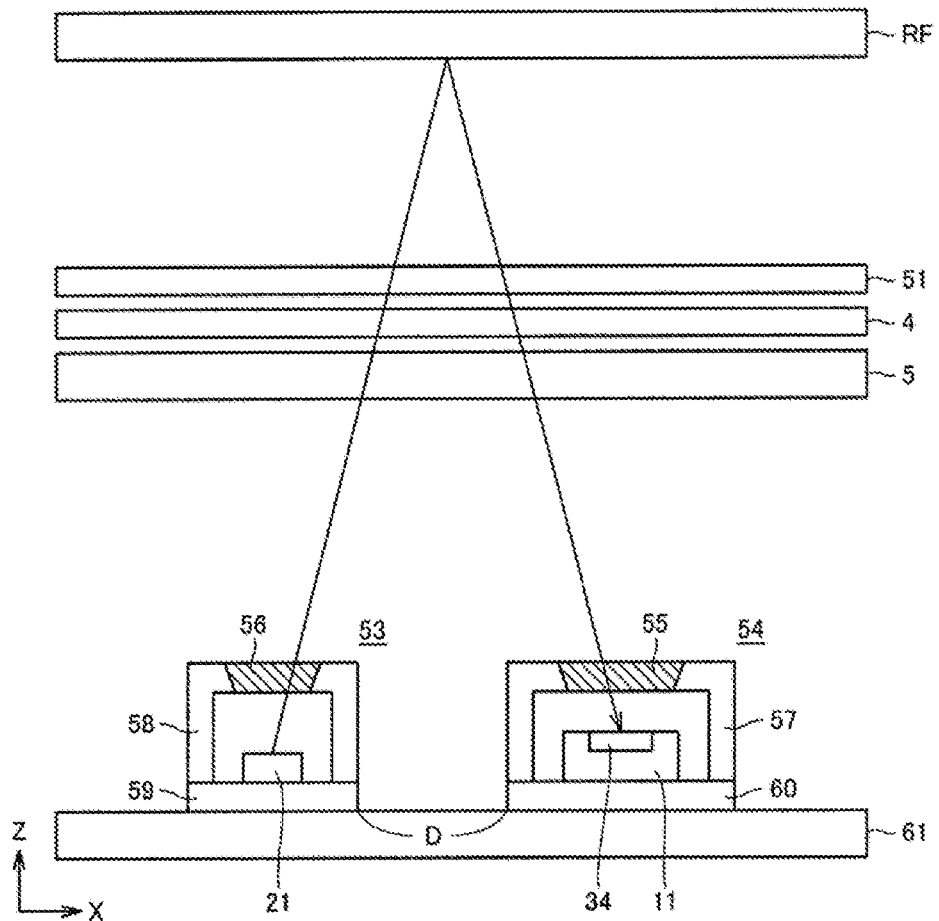
FIG. 6 is a diagram of the arrangement of the proximity sensor 9 according to the first embodiment.

FIG. 6 shows a diagram of the arrangement of the proximity sensor 9 according to the first embodiment. FIG. 6 shows an arrangement in a plane parallel to the XZ plane.

The touch panel 4 is disposed under a cover plate 51. The OLED panel 5 is disposed under the touch panel 4. A main substrate 61 is disposed under the OLED panel 5. A light receiving IC module 54 and an LED module 53 are disposed on the main substrate 61.

The light receiving IC module 54 includes a base substrate 60, the light receiving IC 11, a case component 57 and a light focusing component 55. The light receiving IC 11 is electrically connected to the main substrate 61. The light focusing component 55 focuses the infrared light reflected by the object RF, and forwards the focused infrared light to the light receiving element 34 in the light receiving IC 11.

The LED module 53 includes a base substrate 59, an LED 21, a case component 58 and a light focusing component 56. The LED 21 is electrically connected to the main substrate 61. The light focusing component 56 focuses the infrared light emitted from the LED 21, and outputs the infrared light to the outside of the LED module 53.

A distance D from the LED module 53 to the light receiving IC module 54 is adjusted as follows: the infrared light emitted from the LED 21 is reflected by the object RF and is inputted to the light receiving element 34 upon returning, and the infrared light emitted from the LED 21 is reflected by the OLED panel 5 or the touch panel 4 and is not inputted to the light receiving element 34 upon returning.

As described above, according to this embodiment, the OLED panel is used as a display panel, and the LED and the light receiving IC are disposed under the OLED panel. Thus, the area of the bezel may be reduced, and the area of the OLED panel may be increased as a result.

Second Embodiment

In a smart phone of this embodiment, the proximity sensor includes two LEDs, and thus the power of one LED is accordingly lowered.

Figure 7:
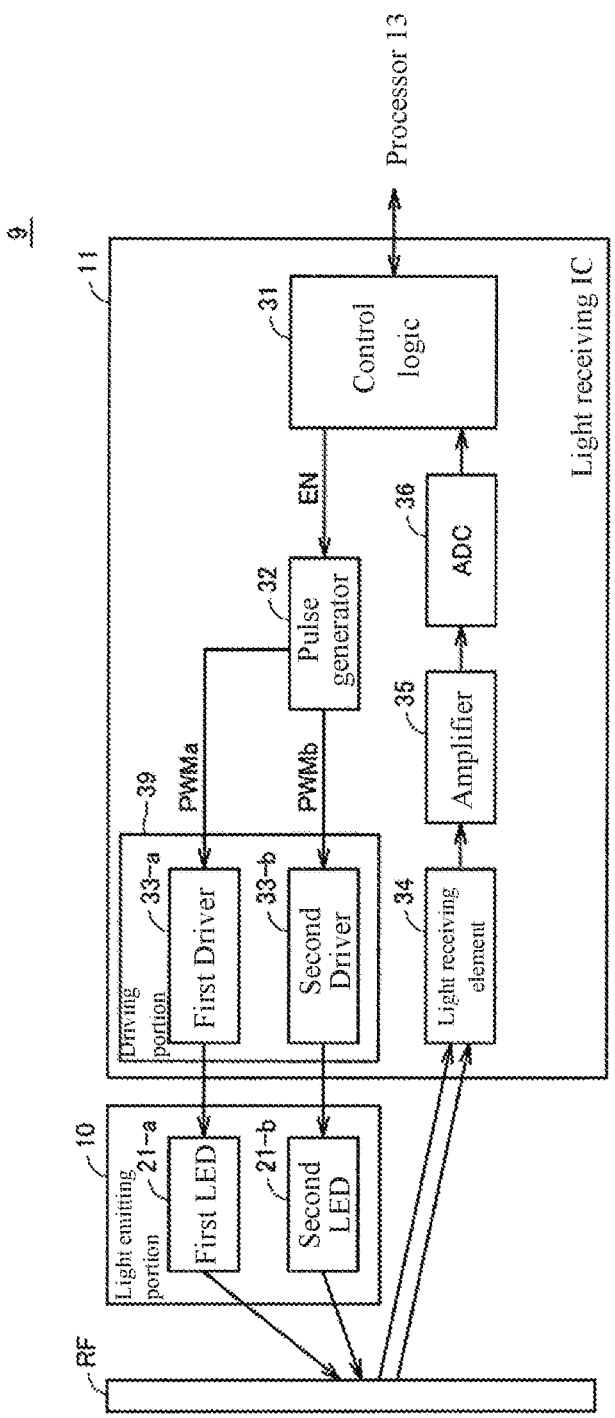
FIG. 7 is a diagram of the configuration of the proximity sensor 9 according to a second embodiment.

FIG. 7 shows a diagram of the configuration of the proximity sensor 9 according to a second embodiment.

The light receiving IC 11 includes a control logic 31, a pulse generator 32, a driving portion 39 including a first driver 33-$a$ and a second driver 33-$b$, a light receiving element 34, an amplifier 35, and an ADC 36. The light emitting portion 10 includes a first LED 21-$a$ and a second LED 21-$b$.

The control logic 31 controls driving of the first LED 21-$a$ and the second LED 21-$b$ according to an instruction from the processor 13, and notifies the processor 13 of whether infrared light is received.

The pulse generator 32 outputs a first PWM signal PWMa and a second PWM signal PWMb.

The first driver 33-$a$ drives the first LED 21-$a$ according to the first PWM signal PWMa, and the second driver 33-$b$ drives the second LED 21-$b$ according to the second PWM signal PWMb.

The light receiving element 34 detects the infrared light reflected by the object RF, and is composed of a photodiode.

The amplifier 35 amplifies an output signal of the light receiving element 34.

The ADC 36 converts an output signal of the amplifier 35 into a digital signal, and outputs the digital signal to the control logic 31.

Figure 8:
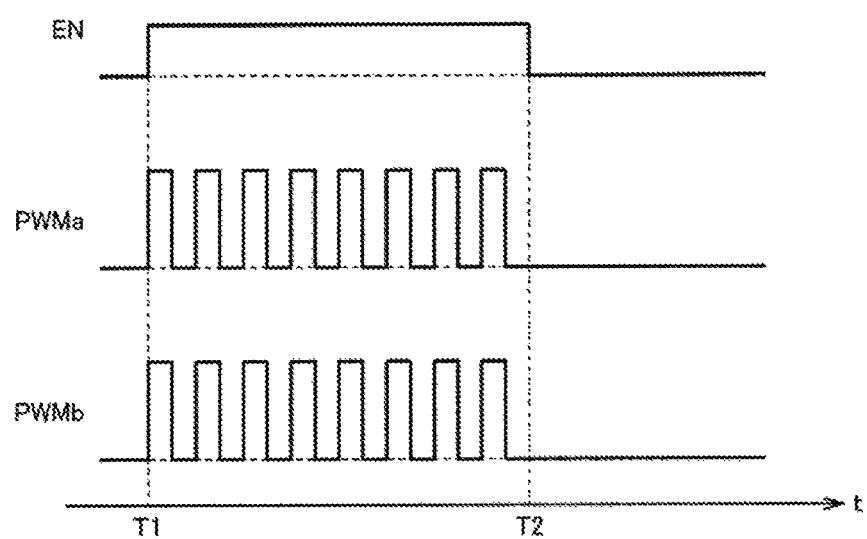
FIG. 8 is a timing diagram of an enable signal EN, a first PWM (Pulse Width Modulation) signal PWMa and a second PWM signal PWMb.

FIG. 8 shows a timing diagram of an enable signal EN, the first PWM signal PWMa, and the second PWM signal PWMb.

If the enable signal EN is activated by the control logic 31 at a timing T1, the first PWM signal PWMa and the second PWM signal PWMb generated by the pulse generator 32 are started at the timing T1. Thus, the start timing of infrared light emitted from the first LED 21-$a$ may be synchronized with the start timing of the infrared light emitted from the second LED 21-$b$.

If the enable signal EN is deactivated by the control logic 31 at a timing T2, the first PWM signal PWMa and the second PWM signal PWMb generated by the pulse generator 32 are ended at the timing T2. Thus, the end timing of infrared light emitted from the first LED 21-$a$ may be synchronized with the end timing of the infrared light emitted from the second LED 21-$b$.

Figure 9:
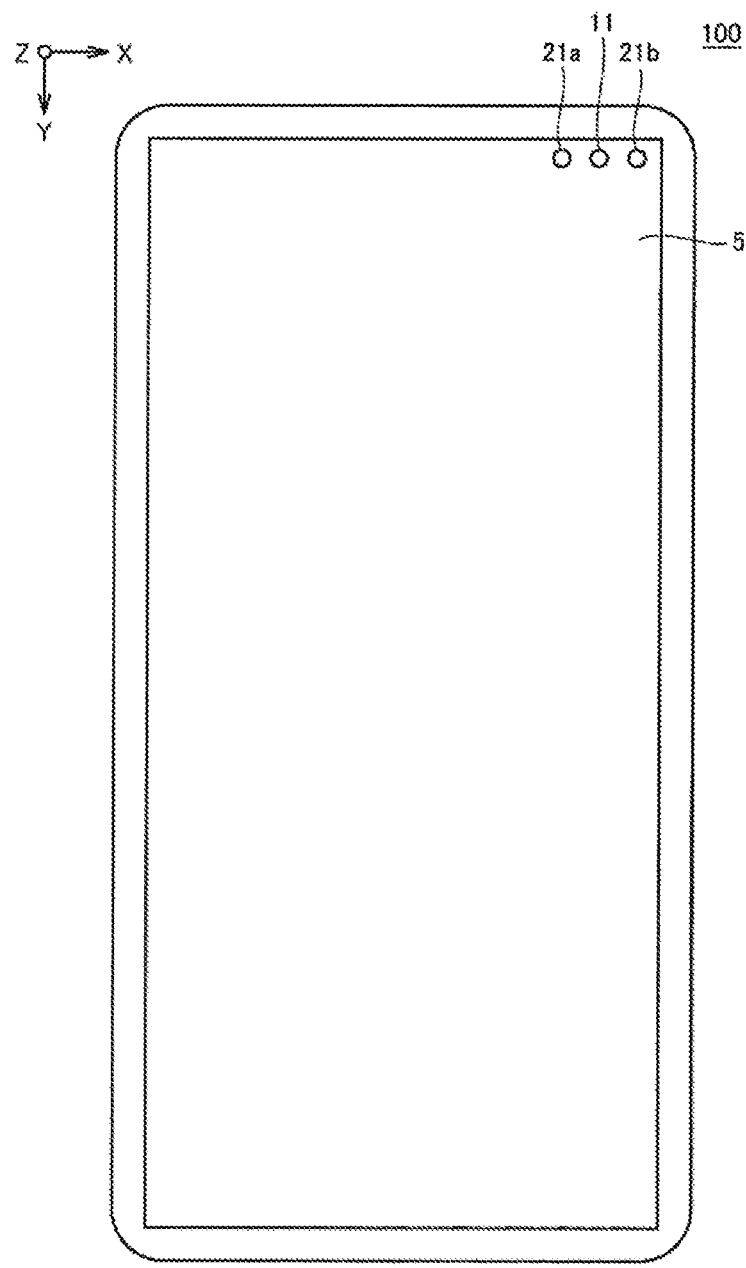
FIG. 9 is a diagram of the arrangement of the proximity sensor 9 according to the second embodiment.

FIG. 9 shows a diagram of the arrangement of the proximity sensor 9 according to the second embodiment.

In the proximity sensor of the second embodiment, the light receiving IC 11, the first LED 21-$a$ and the second LED 21-$b$ are disposed in a region that is under the OLED panel 5 and is covered by the OLED panel 5. That is to say, when the position of the OLED panel 5 is a rectangular region represented by (x1, y1) to (x2, y2), the light receiving IC 11, the first LED 21-$a$ and the second LED 21-$b$ are disposed in the rectangular region. The center of the first LED 21-$a$ and the center of the second LED 21-$b$ are configured on a straight line passing through the center of the light receiving element 34 included in the light receiving IC 11.

Similar to the first embodiment, since the light receiving IC 11, the first LED 21-$a$ and the second LED 21-$b$ are also disposed under the OLED panel 5 in the second embodiment, ensuring a region for disposing the light receiving IC 11, the first LED 21-$a$ and the second LED 21-$b$ in the bezel 97 is also not necessary. Hence, the area of the bezel 97 may be reduced, and the area of the OLED panel 5 may be increased as a result.

By emitting infrared light from two LEDs, the power of one LED may be lowered, and heat generated by the emission of the infrared light may be dispersed.

Figure 10:
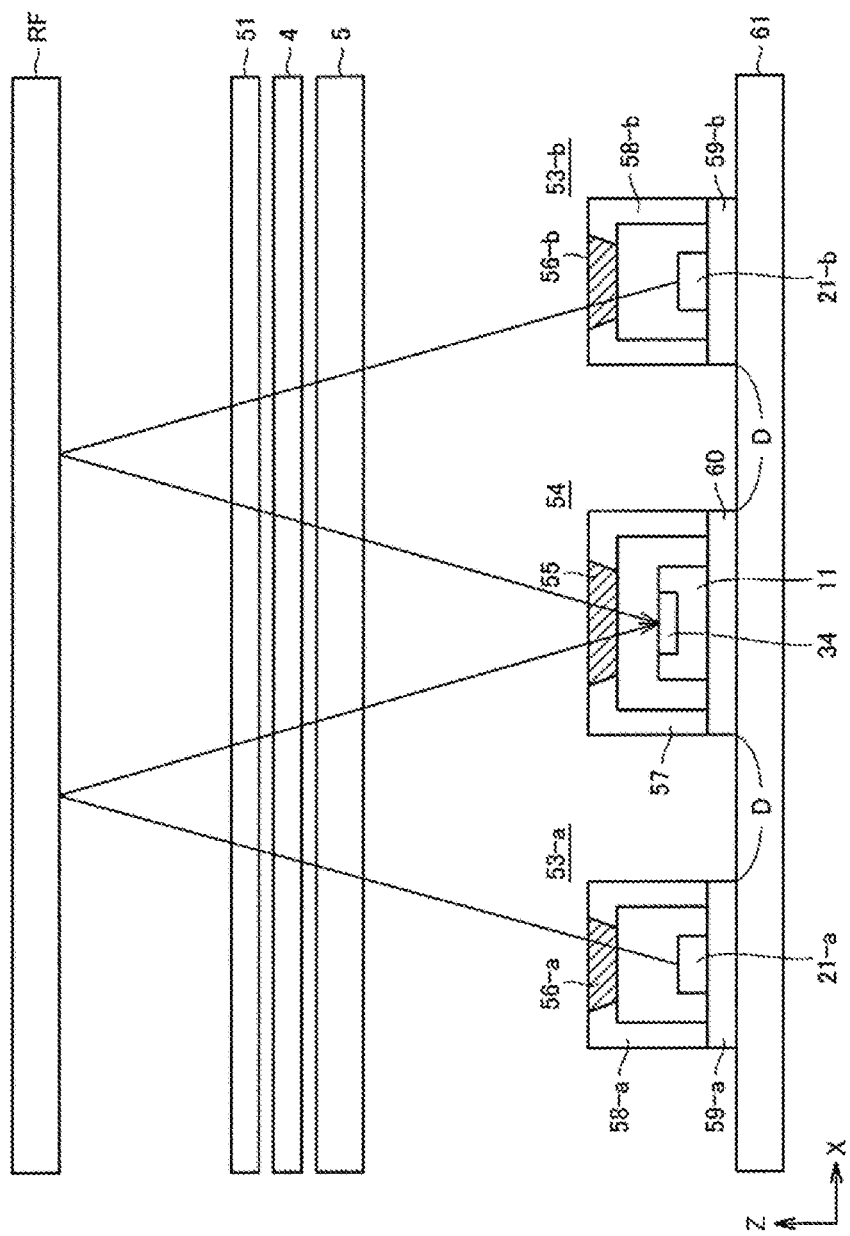
FIG. 10 is a diagram of the arrangement of the proximity sensor 9 according to the second embodiment.

FIG. 10 shows a diagram of the arrangement of the proximity sensor 9 according to the second embodiment, and indicates the arrangement in a plane parallel to the XZ plane.

The touch panel 4 is disposed under the cover plate 51. The OLED panel 5 is disposed under the touch panel 4. The main substrate 61 is disposed under the OLED panel 5. A light receiving IC module 54, a first LED module 53-$a$ and a second LED module 53-$b$ are disposed on the main substrate 61.

The light receiving IC module 54 includes a base substrate 60, a light receiving IC 11, a case component 57 and a light focusing component 55. The light receiving IC 11 is electrically connected to the main substrate 61. The light focusing component 55 focuses infrared light reflected by an object RF, and forwards the focused infrared light to the light receiving element 34 in the light receiving IC 11.

The first LED module 53-$a$ includes a base substrate 59-$a$, the first LED 21-$a$, a case component 58-$a$ and a light focusing component 56-$a$. The first LED 21-$a$ is electrically connected to the main substrate 61. The light focusing component 56-*a* focuses infrared light emitted from the first LED 21-*a*, and outputs the focused infrared light to the outside of the first LED module 53-*a*.

The second LED module 53-*b* includes a base substrate 59-*b*, a second LED 21-*b*, a case component 58-*b* and a light focusing component 56-*b*. The second LED 21-*b* is electrically connected to the main substrate 61. The light focusing component 56-*b* focuses infrared light emitted from the second LED 21-*b*, and outputs the focused infrared light to the outside of the second LED module 53-*b*.

The distance D from the first LED module 53-*a* to the light receiving IC module 54 is adjusted as follows: the infrared light emitted from the first LED 21-*a* is reflected by the object RF and is inputted to the light receiving element 34 upon returning, and the infrared light emitted from the first LED 21-*a* is reflected by the OLED panel 5 or the touch panel 4 and is not inputted to the light receiving element 34 upon returning.

The distance D from the second LED module 53-*b* to the light receiving IC module 54 is adjusted as follows: the infrared light emitted from the second LED 21-*b* is reflected by the object RF and is inputted to the light receiving element 34 upon returning, and the infrared light emitted from the second LED 21-*b* is reflected by the OLED panel 5 or the touch panel 4 and is not inputted to the light receiving element 34 upon returning.

As described above, according to this embodiment, the number of LEDs forming the proximity sensor is configured as plural, hence dispersing the heat generated by the emission of the infrared light. Thus, heat applied on the OLED panel may be dispersed.

Third Embodiment

Figure 11:
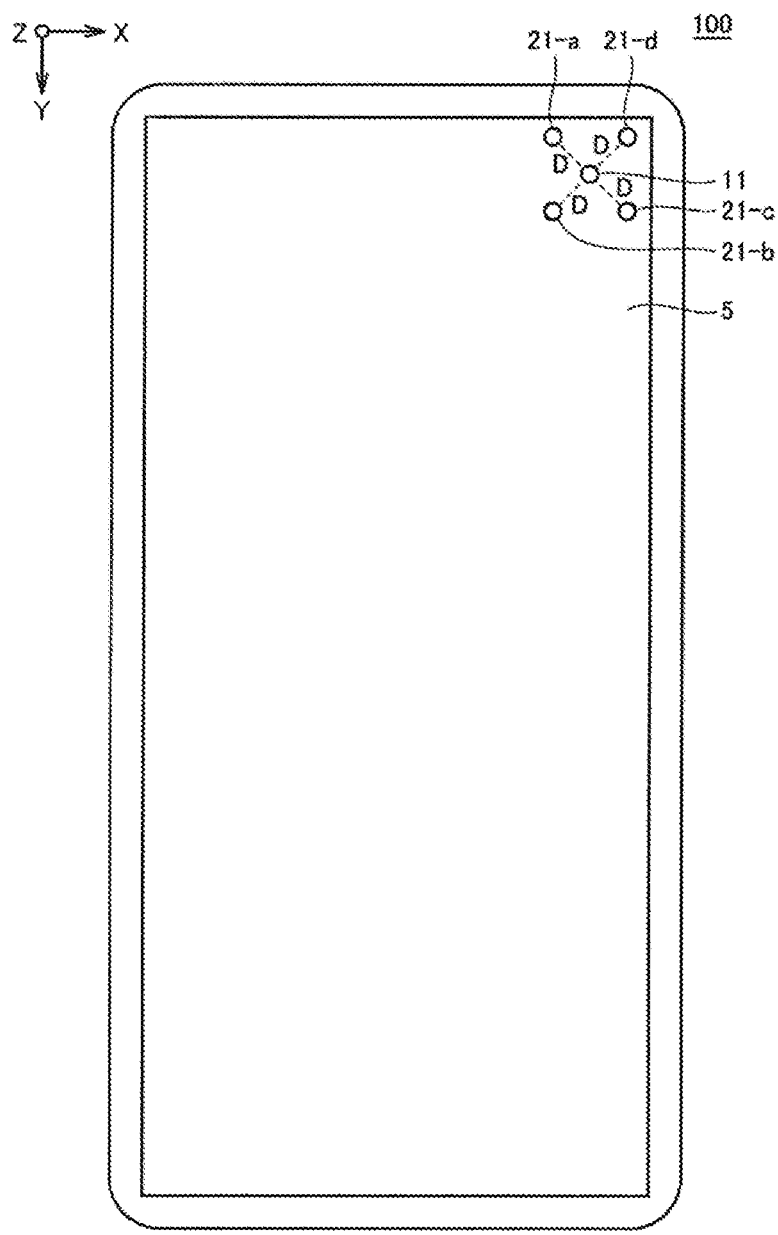
FIG. 11 is a diagram of the arrangement of the proximity sensor 9 according to a third embodiment.

FIG. 11 shows a diagram of the arrangement of the proximity sensor 9 according to a third embodiment.

In the proximity sensor of the third embodiment, a light receiving IC 11, a first LED 21-*a*, a second LED 21-*b*, a third LED 21-*c* and a fourth LED 21-*d* are disposed under the OLED panel 5.

Similar to the first embodiment, since the light receiving IC 11, the first LED 21-*a*, the second LED 21-*b*, the third LED 21-*c* and the fourth LED 21-*d* are also disposed in a region that is under the OLED panel 5 and is covered by the OLED panel 5 in the third embodiment, ensuring a region for disposing the light receiving IC 11, the first LED 21-*a*, the second LED 21-*b*, the third LED 21-*c* and the fourth LED 21-*d* in the bezel 97 is also not necessary. Hence, the area of the bezel 97 may be reduced, and the area of the OLED panel 5 may be increased as a result.

In the third embodiment, by emitting infrared light from four LEDs, the power of one LED may be lowered, and heat generated by the emission of the infrared light may be dispersed.

In the third embodiment, respective centers of a pair of LEDs among the plurality of LEDs are configured on positions symmetric with respect to a center that is the center of the light receiving element 34. More specifically, the center of the first LED 21-*a* and the center of the third LED 21-*c* are configured on positions symmetric with respect to a center that is the center of the light receiving element 34, and the center of the second LED 21-*b* and the center of the fourth LED 21-*d* are configured on positions symmetric with respect to a center that is the center of the light receiving element 34. Thus, heat generated by the emission of the infrared light may be appropriately dispersed.

Distances from the first LED 21-*a*, the second LED 21-*b*, the third LED 21-*c* and the fourth LED 21-*d* to the light receiving IC module 54 are a same distance D. The distance D is adjusted as follows: the infrared light emitted from the first LED 21-*a*, the second LED 21-*b*, the third LED 21-*c* and the fourth LED 21-*d* is reflected by the object RF and is inputted to the light receiving element 34 upon returning, and the infrared light emitted from the first LED 21-*a*, the second LED 21-*b*, the third LED 21-*c* and the fourth LED 21-*d* is reflected by the OLED panel 5 or the touch panel 4 and is not inputted to the light receiving element 34 upon returning.

As described above, according to this embodiment, the heat generated by the emission of the infrared light may be dispersed by symmetrically arranging the plurality of LEDs forming the proximity sensor. Thus, heat applied on the OLED panel may be dispersed.

Fourth Embodiment

Figure 12:
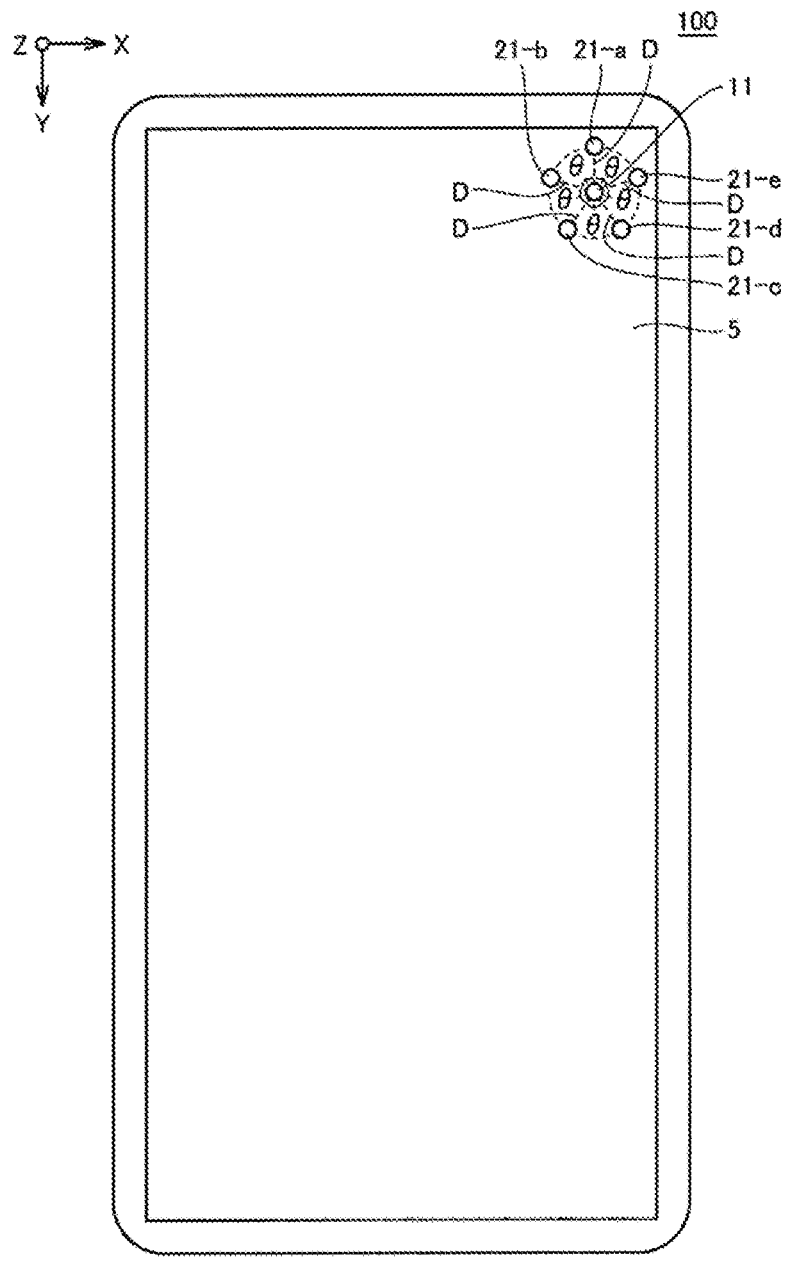
FIG. 12 is a diagram of the arrangement of the proximity sensor 9 according to a fourth embodiment.

FIG. 12 shows a diagram of the arrangement of the proximity sensor 9 according to a fourth embodiment.

In the proximity sensor of the fourth embodiment, a light receiving IC 11, a first LED 21-*a*, a second LED 21-*b*, a third LED 21-*c*, a fourth LED 21-*d* and a fifth LED 21-*e* are disposed under the OLED panel 5.

Similar to the first embodiment, since the light receiving IC 11 and the five LEDs (21-*a*, 21-*b*, 21-*c*, 21-*d* and 21-*e*) are also disposed in a region that is under the OLED panel 5 and is covered by the OLED panel 5 in the fourth embodiment, ensuring a region for disposing the light receiving IC 11 and the five LEDs (21-*a*, 21-*b*, 21-*c*, 21-*d* and 21-*e*) in the bezel 97 is also not necessary. Hence, the area of the bezel 97 may be reduced, and the area of the OLED panel 5 may be increased as a result.

In the fourth embodiment, by emitting infrared light from five LEDs, the power of one LED may be lowered, and heat generated by the emission of the infrared light may be dispersed.

The first LED 21-*a*, the second LED 21-*b*, the third LED 21-*c*, the fourth LED 21-*d* and the fifth LED 21-*e* are configured on a circle having a center that is the center of the light receiving element 34. An angle $\theta$ between adjacent LEDs is the same as another. When the proximity sensor includes five LEDs, the five LEDs (21-*a*, 21-*b*, 21-*c*, 21-*d* and 21-*e*) are arranged at an interval of $\theta=72$ degrees. Thus, heat generated by the emission of the infrared light may be appropriately dispersed.

Distances from the first LED 21-*a*, the second LED 21-*b*, the third LED 21-*c*, the fourth LED 21-*d* and the fifth LED 21-*e* to the light receiving IC module 54 are a same distance D. The distance D is adjusted as follows: the infrared light emitted from the first LED 21-*a*, the second LED 21-*b*, the third LED 21-*c*, the fourth LED 21-*d* and the fifth LED 21-*e* is reflected by the object RF and is inputted to the light receiving element 34 upon returning, and the infrared light emitted from the first LED 21-*a*, the second LED 21-*b*, the third LED 21-*c*, the fourth LED 21-*d* and the fifth LED 21-*e* is reflected by the OLED panel 5 or the touch panel 4 and is not inputted to the light receiving element 34 upon returning.

As described above, according to this embodiment, the heat generated by the emission of the infrared light may be dispersed by equidistantly arranging the plurality of LEDs forming the proximity sensor on a circle. Thus, heat applied on the OLED panel may be dispersed.

Fifth Embodiment

Figure 13:
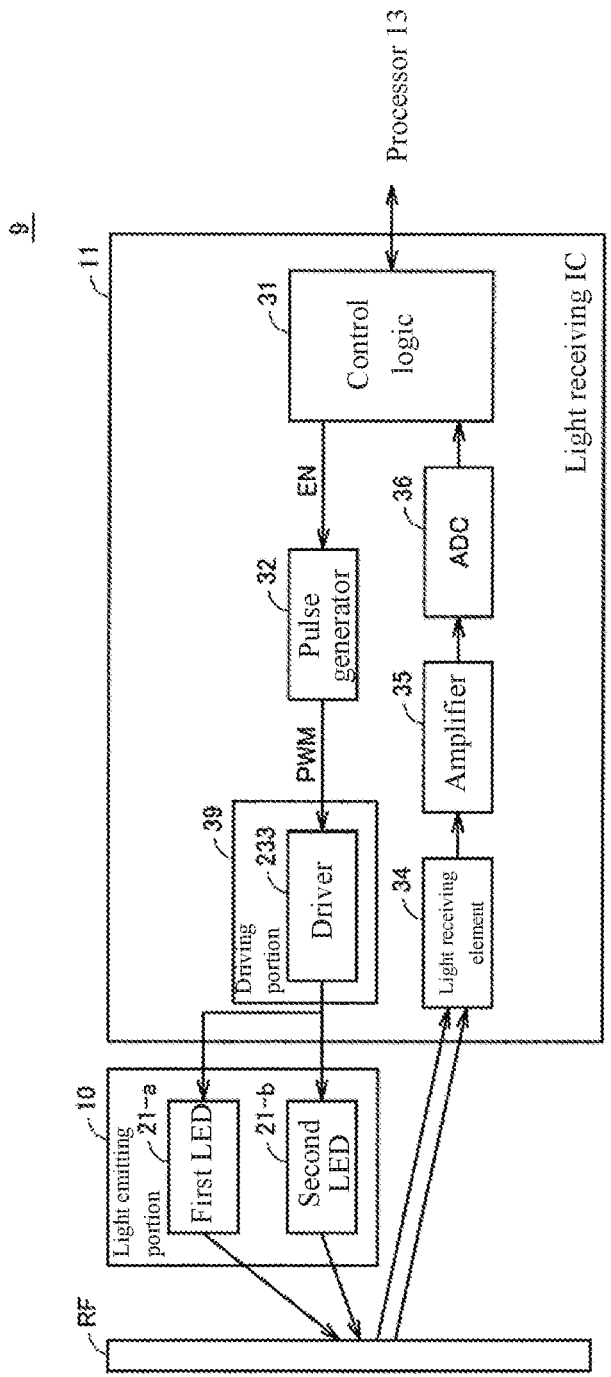
FIG. 13 is a diagram of the arrangement of the proximity sensor 9 according to the fifth embodiment.

FIG. 13 shows a diagram of the configuration of the proximity sensor 9 according to the fifth embodiment.

A light receiving IC 11 includes a control logic 31, a pulse generator 32, a driving portion 39 including a driver 233, a light receiving element 34, an amplifier 35 and an ADC 36. A light emitting portion 10 includes a first LED 21-a and a second LED 21-b.

The control logic 31 controls driving of the first LED 21-a and the second LED 21-b according to an instruction from the processor 13, and notifies the processor 13 of whether infrared light is received.

The pulse generator 32 outputs a PWM signal PWM.

The driver 233 drives the first LED 21-a and the second LED 21-b according to the PWM signal PWM.

The light receiving element 34 detects infrared light reflected by the object RF, and is composed of a photodiode.

The amplifier 35 amplifies an output signal of the light receiving element 34.

The ADC 36 converts an output signal of the amplifier 35 into a digital signal, and outputs the digital signal to the control logic 31.

As described above, in this embodiment, two LEDs may be driven by one driver.

Variation Example

The present invention is not limited to the foregoing embodiments, and may include, for example, the following variation examples.

(1) Although an example of emitting infrared light from an LED and detecting the infrared light by a light receiving element is used above, the present invention is not limited to such example. For example, visible light or near-infrared light may also be emitted from an LED, and the visible light or near-infrared light may be detected by a light receiving element.

(2) The number of LEDs is not limited to the exemplary values specified in the embodiments above. The proximity sensor may also be configured to include three LEDs, or equal to or more than six LEDs.

It should be noted that, the disclosed embodiments are merely examples in all aspects, and are not to be construed as limitations to the present invention. The scope of the present invention is not bound by the foregoing description, and is represented by the appended claims. The scope of the present invention shall include all variations having meanings equivalent to those of the appended claims and all variations made within the scope of the appended claims.

What is claimed is:

1. A light receiving IC adapted to be positioned under a coverage of a vertical projection area of an OLED panel of an electronic device, the light receiving IC comprising:
   a driving portion, wherein the driving portion comprises a first driver and a second driver adapted to be respectively connected to a first LED and a second LED among a plurality of LEDs;
   a pulse generator in communication with the driving portion, configured to transmit a first pulse width modulation signal to the first driver and a second pulse width modulation signal to the second driver;
   a control logic in communication with the pulse generator, configured to synchronize termination of the first pulse width modulation signal and the second pulse width modulation signal; and
   a light receiving element operable to detect reflected light emitted from the first LED or the second LED.

2. The light receiving IC according to claim 1, wherein the driving portion controls infrared light to be concurrently emitted from the first LED and the second LED.

3. A proximity sensor, comprising:
   the light receiving IC of claim 1; and
   the plurality of the LEDs.

4. The proximity sensor according to claim 3, wherein the light receiving IC and the plurality of LEDs are configured on mutually different modules.

5. The proximity sensor according to claim 3, wherein respective centers of a pair of LEDs among the plurality of LEDs are configured on positions symmetric with respect to a center that is the center of the light receiving element.

6. The proximity sensor according to claim 3, wherein the plurality of LEDs are equidistantly arranged on a circle having a center that is the center of the light receiving element.

7. An electronic machine, comprising:
   the OLED panel; and
   the proximity sensor of claim 3.

8. The light receiving IC according to claim 1, wherein the control logic generates an enable signal to activate the transmission of the first pulse width modulation signal and the second pulse width modulation signal, beginning of the emitting of light from the first LED and the second LED are synchronized with beginning of the enable signal.

9. The light receiving IC according to claim 8, wherein the control logic terminates the enable signal to deactivate the transmission of the first pulse width modulation signal and the second pulse width modulation signal, termination of the emitting of light from the first LED and the second LED are synchronized with a termination of the enable signal.

10. The light receiving IC according to claim 1, wherein the light receiving element transmits an output signal to the control logic upon the detection of reflected light.

11. The light receiving IC according to claim 10, further comprising an analog to digital converter between the control logic and the light receiving element, configured to convert the output signal to a digital signal.

12. The light receiving IC according to claim 11, further comprising an amplifier connecting between the light receiving element and the analog to digital converter.

13. The light receiving IC according to claim 1, further comprising a processor, configured to receive a notification signal from the control logic according to the detection of reflected light.

14. An electronic machine, comprising:
   the light receiving IC of claim 1;
   the plurality of LEDs; and
   the OLED panel, wherein the light receiving IC is disposed under a coverage of a vertical projection area of the OLED panel.

15. The electronic machine according to claim 14, further comprising a touch panel, wherein the OLED panel is between the touch panel and the light receiving IC.

16. The electronic machine according to claim 15, wherein the light receiving element is disposed at a position free from receiving the light deflected by the touch panel.

17. The electronic machine according to claim 15, further comprising a cover layer, wherein the touch panel is between the cover layer and the OLED panel.

18. The electronic machine according to claim 15, further comprising a bezel laterally surrounding the touch panel, wherein at least a portion of the light receiving IC is free from being under a coverage of a vertical projection area of the bezel.

19. The electronic machine according to claim 14, further comprising:
   a first case component laterally surrounding one of the plurality of LEDs; and
   a second case component laterally surrounding the light receiving IC, wherein the first case component is spaced apart from the second case component.

20. The electronic machine according to claim 19, wherein the first case component and the second case component are under a coverage of a vertical projection area of the touch panel.

* * * * *